United States Patent
Dogiamis et al.

(10) Patent No.: US 12,300,579 B2
(45) Date of Patent: May 13, 2025

(54) LIQUID COOLED INTERPOSER FOR INTEGRATED CIRCUIT STACK

(71) Applicant: Intel Corporation, Santa Clara, CA (US)

(72) Inventors: Georgios Dogiamis, Chandler, AZ (US); Qiang Yu, Saratoga, CA (US); Feras Eid, Chandler, AZ (US); Adel Elsherbini, Tempe, AZ (US); Kimin Jun, Portland, OR (US); Johanna Swan, Scottsdale, AZ (US); Shawna Liff, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 821 days.

(21) Appl. No.: 17/346,895

(22) Filed: Jun. 14, 2021

(65) Prior Publication Data
US 2022/0399249 A1    Dec. 15, 2022

(51) Int. Cl.
*H01L 23/473* (2006.01)
*H01L 23/13* (2006.01)
(Continued)

(52) U.S. Cl.
CPC ............ *H01L 23/473* (2013.01); *H01L 23/13* (2013.01); *H01L 23/5383* (2013.01);
(Continued)

(58) Field of Classification Search
CPC ... H01L 23/473; H01L 23/13; H01L 23/5383; H01L 25/0657; H01L 24/08; H01L 24/32;
(Continued)

(56) References Cited

U.S. PATENT DOCUMENTS

| 2008/0150162 A1* | 6/2008 | Koizumi | H01L 23/473 |
| | | | 257/E23.098 |
| 2014/0083858 A1 | 3/2014 | Teh et al. | |

(Continued)

OTHER PUBLICATIONS

International Search Report and Written Opinion for PCT Application No. PCT/US2022/019495, dated Jun. 23, 2022.
(Continued)

*Primary Examiner* — Peniel M Gumedzoe
(74) *Attorney, Agent, or Firm* — Essential Patents Group, LLP

(57) ABSTRACT

An integrated circuit (IC) package may be fabricated having an interposer, one or more microfluidic channels through the interposer, a first IC chip attached to a first side of the interposer, and a second IC chip attached to a second side of the interposer, where the first side of the interposer includes first bond pads coupled to first bond pads of the first IC chip, and the second side of the interposer includes second bond pads coupled to first bond pads of the second IC chip. In an embodiment of the present description, a liquid cooled three-dimensional IC (3DIC) package may be formed with the IC package, where at least two IC devices may be stacked with a liquid cooled interposer. In a further embodiment, the liquid cooled 3DIC package may be electrically attached to an electronic board. Other embodiments are disclosed and claimed.

20 Claims, 16 Drawing Sheets

(51) Int. Cl.
*H01L 23/538* (2006.01)
*H01L 25/065* (2023.01)
*H05K 7/20* (2006.01)
*H01L 23/00* (2006.01)

(52) U.S. Cl.
CPC ..... *H01L 25/0657* (2013.01); *H05K 7/20272* (2013.01); *H05K 7/20281* (2013.01); *H01L 24/08* (2013.01); *H01L 24/32* (2013.01); *H01L 2224/08225* (2013.01); *H01L 2224/32225* (2013.01); *H01L 2225/06548* (2013.01); *H01L 2225/06572* (2013.01); *H01L 2225/06589* (2013.01)

(58) Field of Classification Search
CPC . H01L 2224/08225; H01L 2224/32225; H01L 2225/06548; H01L 2225/06572; H01L 2225/06589; H05K 7/20272; H05K 7/20281
See application file for complete search history.

(56) References Cited

U.S. PATENT DOCUMENTS

| | | |
|---|---|---|
| 2014/0362552 A1 | 12/2014 | Murayama et al. |
| 2014/0376189 A1* | 12/2014 | Sakaguchi ............ H01L 23/473 174/252 |
| 2017/0179001 A1 | 6/2017 | Brunschwiler et al. |
| 2020/0105643 A1* | 4/2020 | Wan ........................ H01L 25/18 |
| 2020/0279813 A1 | 9/2020 | Liff et al. |
| 2020/0402888 A1 | 12/2020 | Tsutsui et al. |
| 2021/0098411 A1 | 4/2021 | Liff et al. |
| 2021/0159163 A1 | 5/2021 | Liff et al. |
| 2021/0159179 A1 | 5/2021 | Elsherbini et al. |

OTHER PUBLICATIONS

International Preliminary Report on Patentability from PCT/US2022/019495 notified Dec. 28, 2023, 8 pgs.

* cited by examiner

LIQUID COOLED INTERPOSER FOR INTEGRATED CIRCUIT STACK

TECHNICAL FIELD

Embodiments of the present description generally relate to the field of integrated circuit package fabrication, and, more specifically, to an integrated circuit assembly including microfluidic channels for thermal management of an integrated circuit chip.

BACKGROUND

The integrated circuit industry is continually striving to produce ever faster, smaller, and thinner integrated circuit packages for use in various electronic products, including, but not limited to, computer servers and portable products, such as portable computers, electronic tablets, cellular phones, digital cameras, and the like.

As a part of this effort, integrated circuit packages containing multiple integrated circuit devices, such as microelectronic dice, have been developed. These multiple integrated, circuit device packages are referred to in the art as multi-device, multi-chip packages (MCPs), or partitioned devices, and offer the potential for increased architectural flexibility at reduced cost, but must do so such that appropriate integrated circuit device-to-integrated circuit device interconnect densities are provided. As will be understood to those skilled in the art, interconnect density is an important consideration because an insufficient number of integrated circuit device connections would limit the bandwidth capability for the affected integrated circuit device interface, and thus would reduce the communication efficiency and capability between integrated circuit devices.

To address interconnection concerns, a bridge may be embedded in a substrate to which the integrated circuit devices are attached. These bridges support dense integrated circuit device-to-integrated circuit device interconnects, such as from a first integrated circuit device edge to a second integrated circuit device edge, and may support a number of signal lines through the bridge itself. Instead of using an expensive silicon interposer with through silicon vias, the bridge may be an inactive silicon structure or an active silicon device that is embedded in the substrate, enabling the dense integrated circuit device-to-integrated circuit device interconnects only where needed. Standard flip-chip processes may be used to connect the integrated circuit devices to the substrate for robust power delivery and to the bridge within the substrate. Thus, a resulting integrated circuit package may be considerably smaller than an integrated circuit package that is only interconnected with conductive routes within the substrate,

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
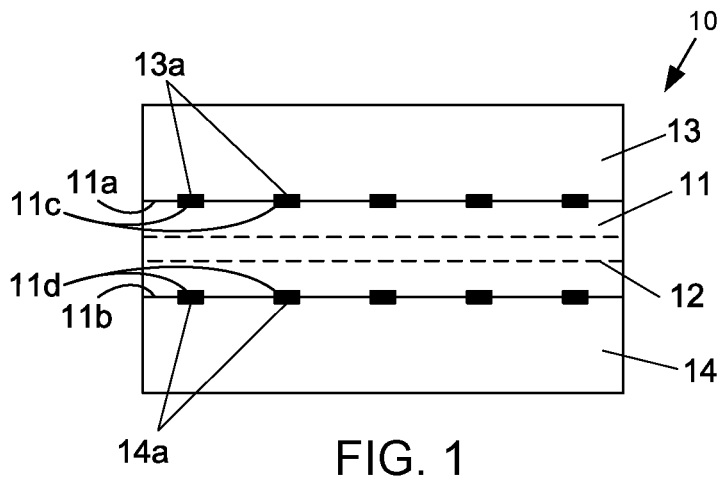
FIGS. 1-6 are illustrative side views of respective integrated circuit packages, according to embodiments of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

With reference to FIG. 1, an embodiment of an integrated circuit (IC) package 10 (e.g., a three dimensional IC (3DIC) package) may include an interposer 11, one or more microfluidic channels 12 through the interposer 11 (shown in FIG. 1 with dashed lines representing as a hidden structure within the interposer 11), a first IC chip 13 attached to a first side 11*a* of the interposer 11, and a second IC chip 14 attached to a second side 11*b* of the interposer 11. In some embodiments, the first side 11*a* of the interposer 11 includes first bond pads 11*c* coupled to first bond pads 13*a* of the first IC chip 13, and the second side 11*b* of the interposer 11 includes second bond pads 11*d* coupled to first bond pads 14*a* of the second IC chip 14. The interposer 11 and the first and second IC chips 13 and 14 may be made from any suitable material and may be attached to each other by any known process. The microfluidic channel(s) 12 may be formed through the interposer 11 by any known process including mechanical drilling with a bit, laser drilling, wet or dry etching, laser assisted etching, etc. In some embodiments, as described in further detail herein, the interposer 11 and the first and second IC chips 13 and 14 may be attached to each other by a hybrid bonding process and the microfluidic channel(s) 12 may be formed in the interposer 11 by a lithographic pattern and etch process.

Figure 2:
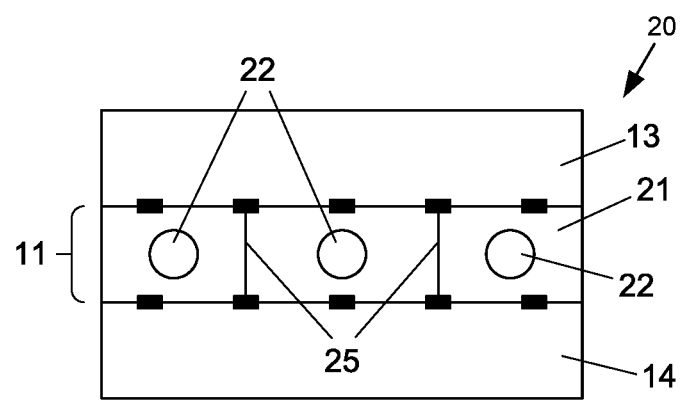

With reference to FIG. 2, an embodiment of a 3DIC package 20 may be similarly configured as the package 10, with similar elements indicated by like numerals. In the 3DIC package 20, the interposer 11 may comprise a bridge 21 between the first IC chip 13 and the second IC chip 14. For example, the bridge 21 may include one or more metal vias 25, or other circuits or interconnects, that couple the first IC chip 13 to the second IC chip 14 outside of the areas of microfluidic channel(s) 22. The bridge 21 may be made from any suitable material by any known process.

Figure 3:
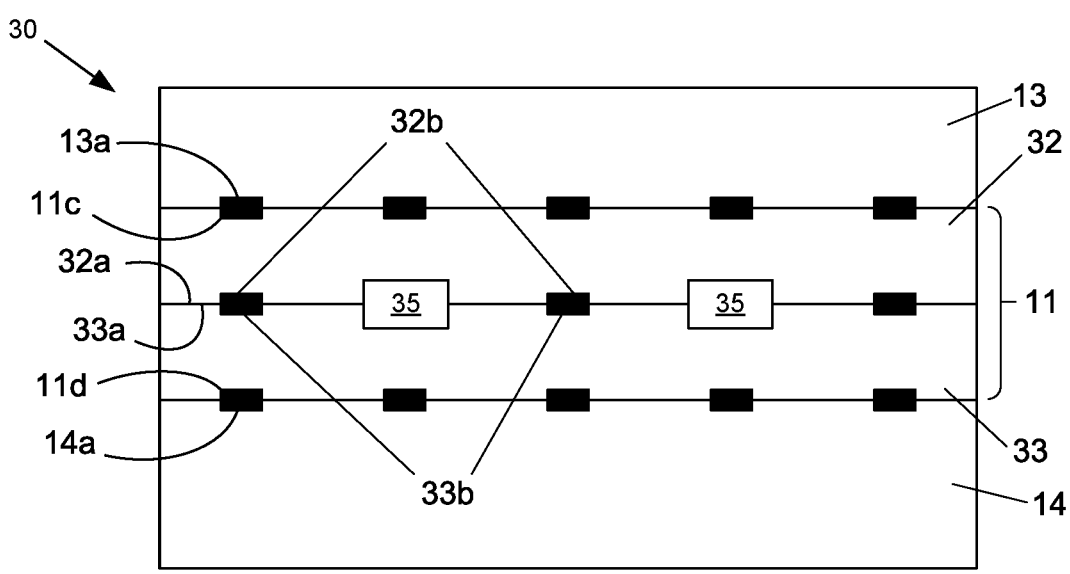

With reference to FIG. 3, an embodiment of a 3DIC package 30 may be similarly configured as the package 10, with similar elements indicated by like numerals. In the 3DIC package 30, the interposer 11 may comprise a top portion 32 attached to a bottom portion 33. A first side 32*a* of the top portion 32 includes first bond pads 32*b* coupled to first bond pads 33*b* on a first side 33*a* of the bottom portion 33. In some embodiments, splitting the interposer 11 into two parts enables microfluidic channel(s) 35 that may be deeper and may also be configured to meet particular cooling needs of the stacked ICs. In the 3DIC package 30, both of the top and bottom portions 32, 33 of the interposer 11 include respective portions of the one or more microfluidic channel(s) 35.

Figure 4:
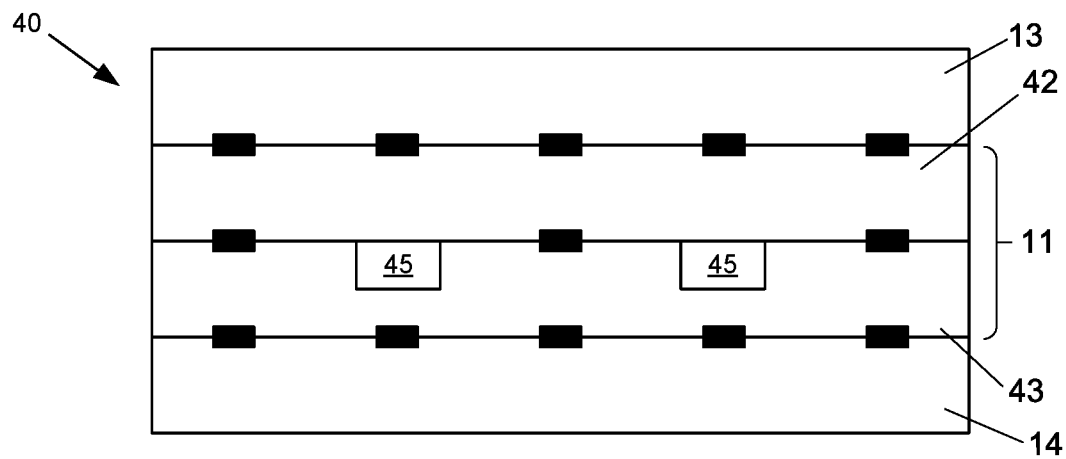

In some embodiments, only one of the top and bottom portions of the interposer 11 may include the one or more microfluidic channels. With reference to FIG. 4, an embodiment of a 3DIC package 40 may be similarly configured as the package 30, with similar elements indicated by like numerals. In the 3DIC package 40, the interposer 11 may comprise a top portion 42 attached to a bottom portion 43, and only the bottom portion 43 of the interposer 11 includes the one or more microfluidic channel(s) 45.

Figure 5:
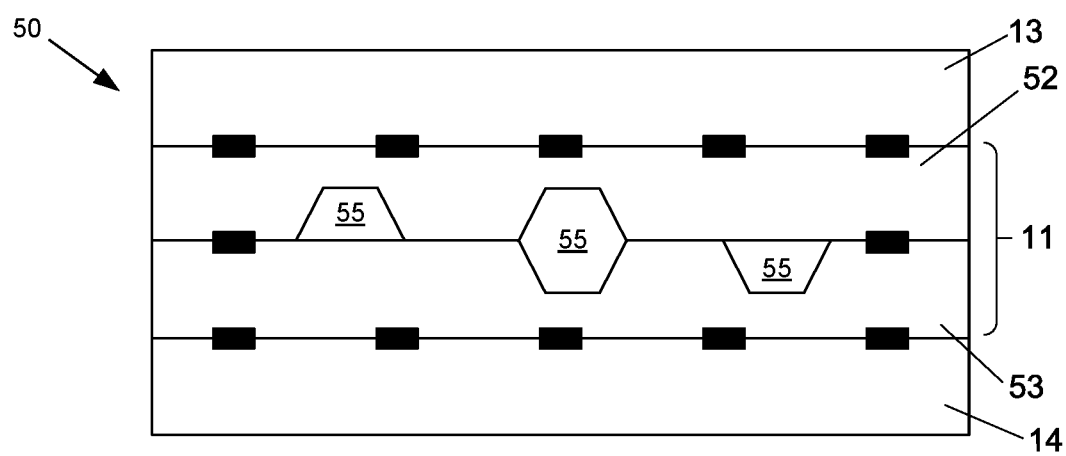

With reference to FIG. 5, an embodiment of a 3DIC package 50 may be similarly configured as the package 30, with similar elements indicated by like numerals. In the 3DIC package 50, the interposer 11 may comprise a top portion 52 attached to a bottom portion 53, and both of the top and bottom portions 52, 53 of the interposer 11 include respective portions of the one or more microfluidic channel (s) 55. As shown in FIGS. 1 to 5, embodiments may include any useful number of microfluidic channels and the channels may include any useful shape or cross sectional shape (e.g., square, rectangular, circular, elliptical, polygonal, etc.).

Figure 6:
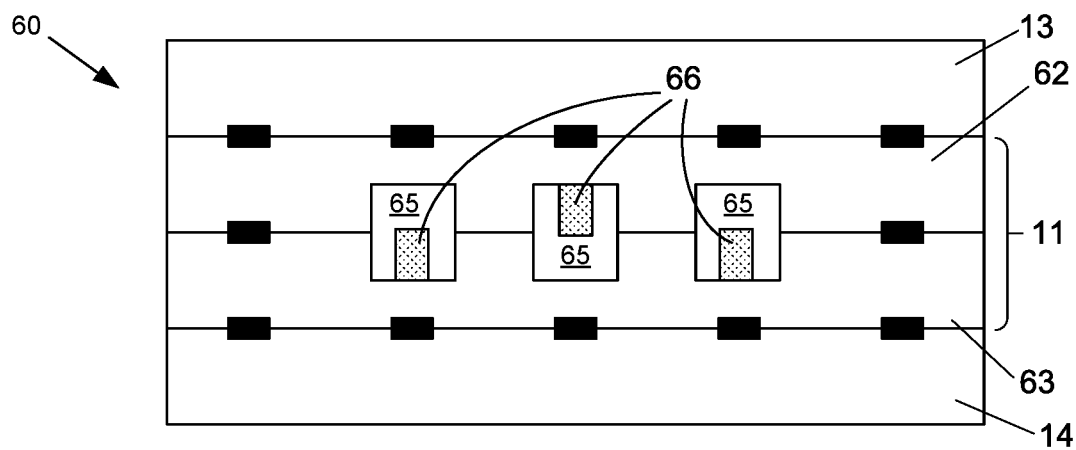

With reference to FIG. 6, an embodiment of a 3DIC package 60 may be similarly configured as the package 30, with similar elements indicated by like numerals. As shown in FIG. 6, the interposer 11 may comprise a top portion 62 attached to a bottom portion 63, and both of the top and bottom portions 62, 63 of the interposer 11 include respective portions of the one or more microfluidic channel(s) 65. In the 3DIC package 60, at least one of the one or more microfluidic channels 65 includes at least one heat dissipation structure 66 that protrudes into the at least one microfluidic channel 65. For example, the structures 66 may be any suitable material made from any known process and may have any useful shape (e.g., such as pins, pillars, pyramids, etc.).

Figure 7A:
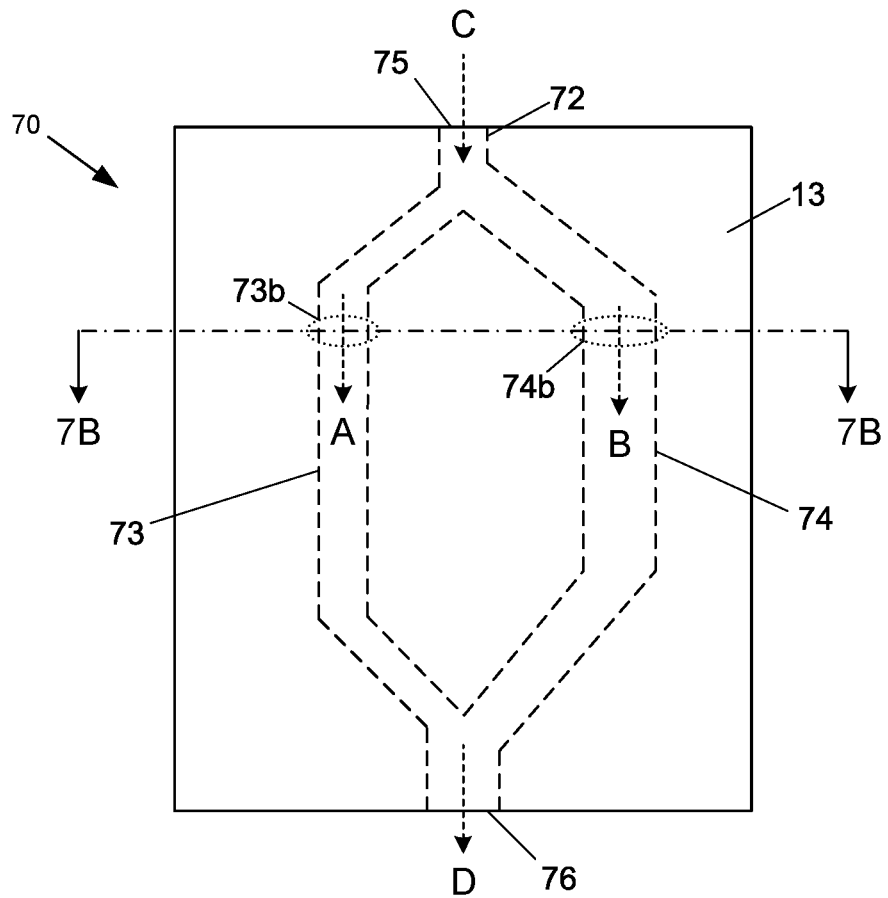
FIGS. 7A-D are top, cross-sectional (along line 7B), front and back views of a three-dimensional integrated circuit package, according to one embodiment of the present description.
Figure 7B:
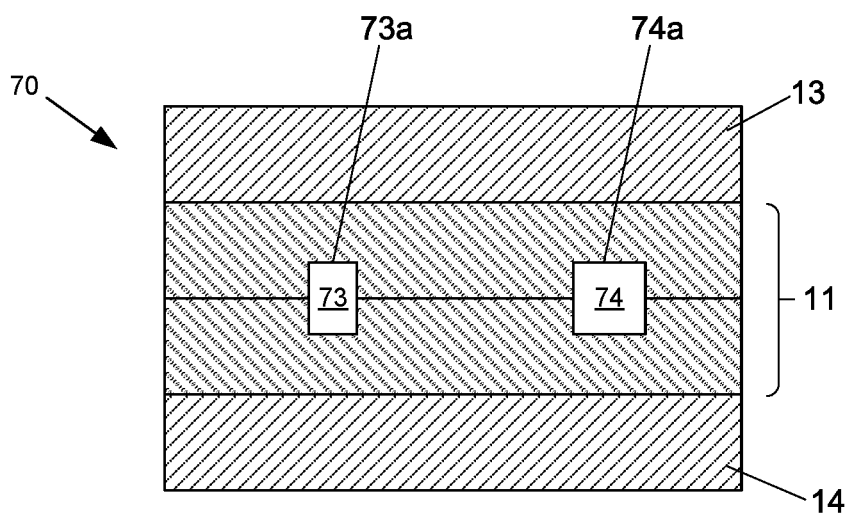
Figure 7C:
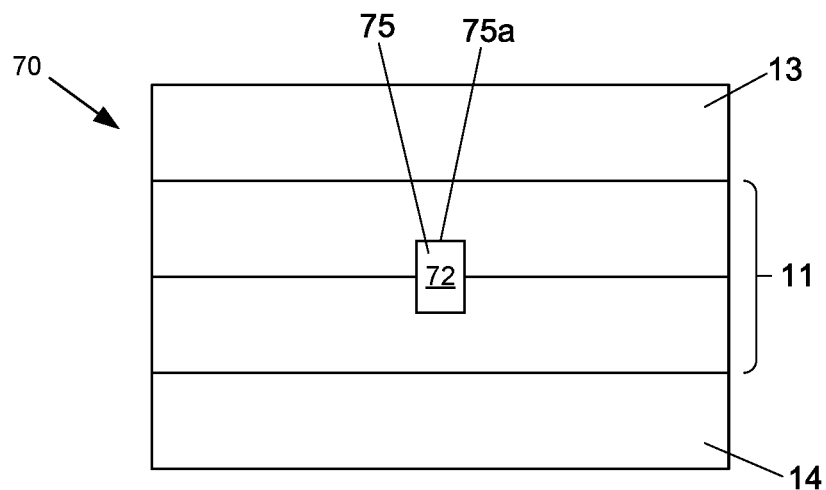
Figure 7D:
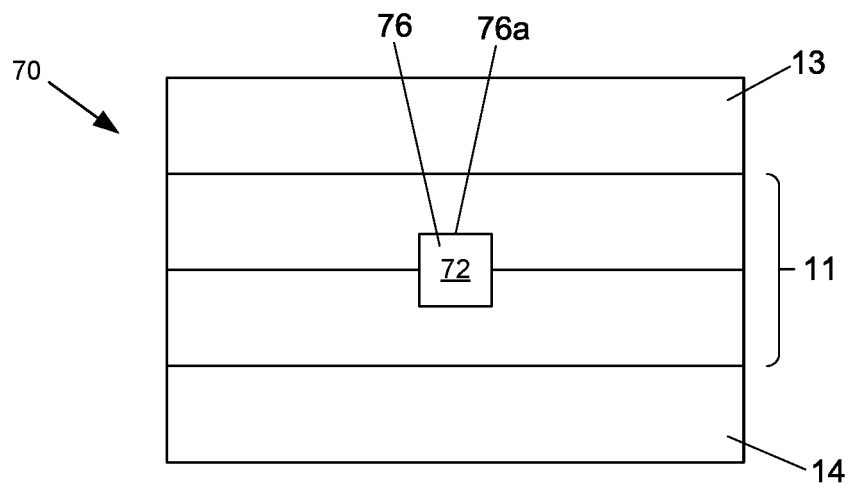

With reference to FIGS. 7A to 7D, an embodiment of a 3DIC package 70 may be similarly configured as the package 30, with similar elements indicated by like numerals. In the 3DIC package 70, the one or more microfluidic channels 72 include at least a first microfluidic channel 73 and a second microfluidic channel 74, where a first cross sectional area 73*a* (see FIG. 7B) of the first microfluidic channel 73 perpendicular to a first flow direction A at a first internal portion 73*b* of the first microfluidic channel 73 is different from a second cross sectional area 74*a* (see FIG. 7B) of the second microfluidic channel 74 perpendicular to a second flow direction B at a second internal portion 74*b* of the second microfluidic channel 74. As shown, in other words, the channel 74 is bigger than the channel 73. As shown in FIGS. 7C and 7D, a first cross sectional area 75*a* (see FIG. 7C) of the one or more microfluidic channels 72 perpendicular to a first flow direction C at an inlet 75 of the interposer 11 is less than a second cross sectional area 76*a* (see FIG. 7D) of the one or more microfluidic channels 72 perpendicular to a second flow direction D at an outlet 76 of the interposer 11 that is in fluid communication with the inlet 75 of the interposer 11. As shown, in other words, the outlet(s) 76 is/are bigger than the inlet(s) 75.

Figure 8:
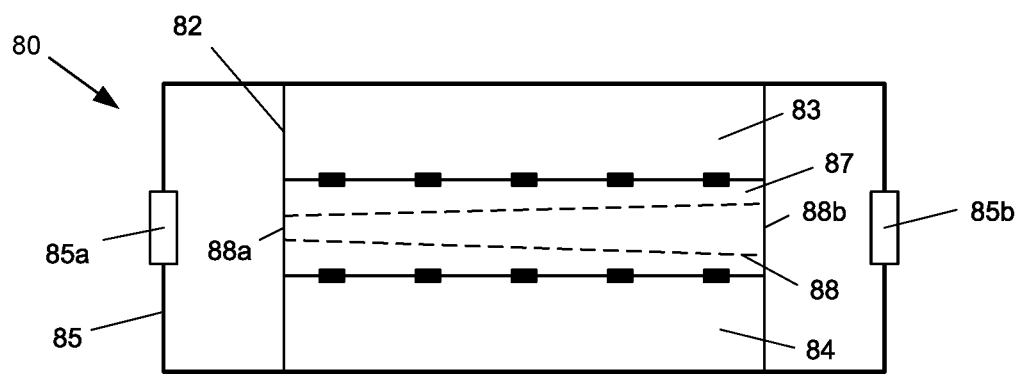
FIG. 8 is an illustrative side views of a liquid cooled three-dimensional integrated circuit package, according to one embodiment of the present description.

With reference to FIG. 8, an embodiment of a liquid cooled 3DIC package 80 may include an IC package 82 including a stack of ICs including at least a first IC chip 83 and a second IC chip 84, and an enclosure 85 attached to the IC package 82. The enclosure 85 includes at least one inlet 85*a* and at least one outlet 85*b*. The IC package 82 may be further configured to include one or more liquid cooling features or aspects of any of the embodiments described herein. For example, the IC package 82 may further include an interposer 87 attached between the first IC chip 83 and the second IC chip 84, and one or more microfluidic channels 88 through the interposer 87 and in fluid communication with at least one inlet 85*a* and one outlet 85*b* of the enclosure 85 In some embodiments, a first side of the interposer 87 includes first bond pads coupled to first bond pads of the first IC chip 83, and a second side of the interposer 87 includes second bond pads coupled to first bond pads of the second IC chip 84.

For example, the first IC chip 83, the interposer 87, and the second IC chip 84 may be attached to each other by hybrid bonding. In some embodiments, the interposer 87 may comprise a bridge between the first IC chip 83 and the second IC chip 84. For example, the interposer 87 may comprise a top portion attached to a bottom portion (e.g., where a first side of the top portion includes first bond pads coupled to first bond pads on a first side of the bottom portion), and either or both of the top and bottom portions of the interposer include respective portions of the one or more microfluidic channels 88. In some embodiments, at least one of the one or more microfluidic channels 88 includes at least one heat dissipation structure that protrudes into the at least one microfluidic channel 88.

The microfluidic channels 88 may have any useful configuration and cross sectional areas. In some embodiments, the one or more microfluidic channels 88 may include at least a first microfluidic channel and a second microfluidic channel, where a first cross sectional area of the first microfluidic channel perpendicular to a first flow direction at a first internal portion of the first microfluidic channel is different from a second cross sectional area of the second microfluidic channel perpendicular to a second flow direction at a second internal portion of the second microfluidic channel. Similarly, inlet(s) 88*a* and outlet(s) 88*b* of the interposer 87 may have any useful configuration and cross sectional area. In some embodiments, a first cross sectional area of the one or more microfluidic channels 88 perpendicular to a first flow direction at an inlet 88*a* of the interposer 87 is less than a second cross sectional area of the one or more microfluidic channels 88 perpendicular to a second flow direction at an outlet 88*b* of the interposer 87 that is in fluid communication with the inlet 88*a* of the interposer 87.

Figure 9:
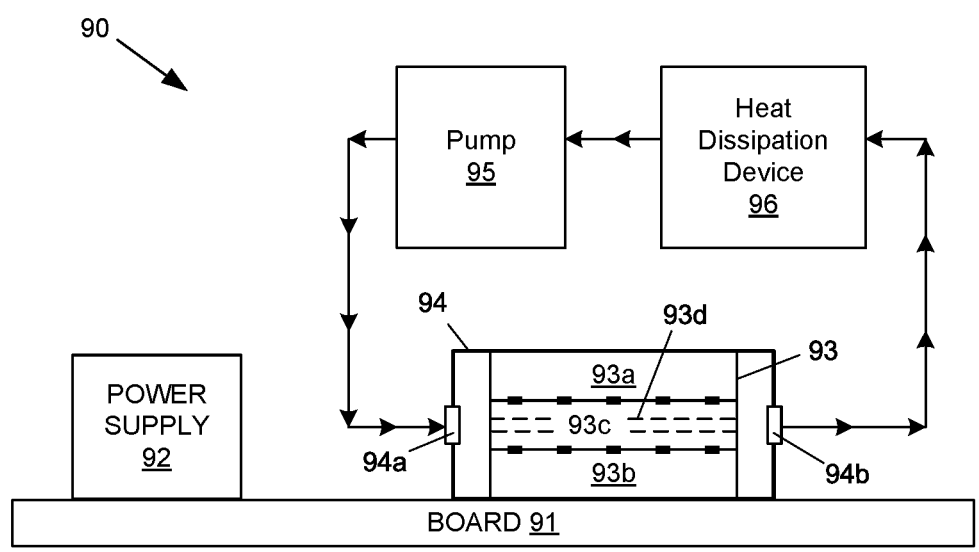
FIG. 9 is a block diagram of an electronic system, according to one embodiment of the present description.

With reference to FIG. 9, an embodiment of an electronic system 90 may include a board 91, a power supply 92 to provide power to one or more IC chips, an IC package 93 coupled to the board 91 and the power supply 92, the IC package 93 including a stack of ICs including at least a first IC chip 93*a* and a second IC chip 93*b*, and an enclosure 94 attached to the IC package 93. The enclosure 94 includes at least one inlet 94*a* and at least one outlet 94*b*. As shown in FIG. 9, the system 90 may also include a pump 95 coupled to at least one inlet 94*a* and at least one outlet 94*b* of the enclosure 94, and a heat dissipation device 96 coupled between at least one outlet of the enclosure and the pump.

The IC package 93 may be further configured to include one or more liquid cooling features or aspects of any of the embodiments described herein. For example, the IC package 93 may further include an interposer 93*c* attached between the first IC chip 93*a* and the second IC chip 93*b*, and one or more microfluidic channels 93*d* through the interposer 93*c* and in fluid communication with at least one inlet 94*a* and one outlet 94*b* of the enclosure 94. In some embodiments, a first side of the interposer 93*c* includes first bond pads coupled to first bond pads of the first IC chip 93*a*, and a second side of the interposer 93*c* includes second bond pads coupled to first bond pads of the second IC chip 93*b*. For example, the interposer 93*c* may comprise a bridge between the first IC chip 93*a* and the second IC chip 93*b*, and the interposer 93*c* may comprise a top portion attached to a bottom portion (e.g., where a first side of the top portion includes first bond pads coupled to first bond pads on a first side of the bottom portion).

Some embodiments provide microfluidic channels built in a standoff substrate for liquid cooling in hybrid bonding technology. Thermal management of a 3DIC may be problematic due to limited heat dissipation capability. Some packages may include microfluidic channels on a single side of the package and/or may include a specific cooling module attached to a single side of a chip, but may not provide satisfactory thermal management for a 3DIC due to the single side attachment. The thermal dissipation path adds more thermal resistance for stacked silicon chips that are farther away from the heat sink.

Some embodiments may overcome one or more of the foregoing problems with an intermediate standoff substrate to form microfluidic channels for liquid cooling of adjacent ICs. By applying liquid cooling to the middle of 3DIC, for example, some embodiments may advantageously cool chips from both sides more efficiently. In addition, some embodiments include an on-chip thermal radiator to improve cooling efficiency further.

Figure 10:
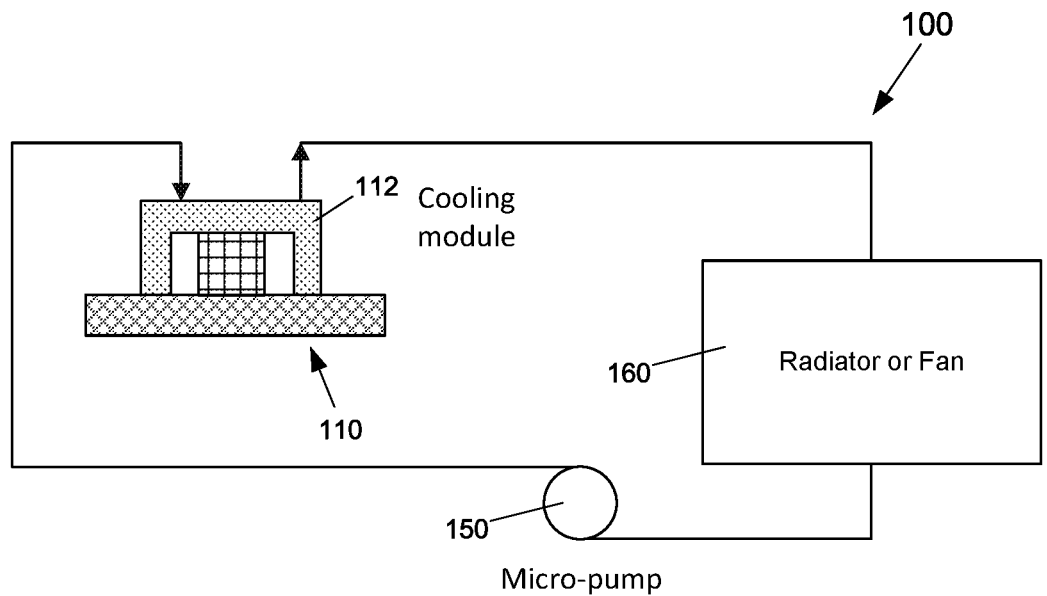
FIG. 10 is a block diagram of another electronic system, according to one embodiment of the present description.
Figure 11:
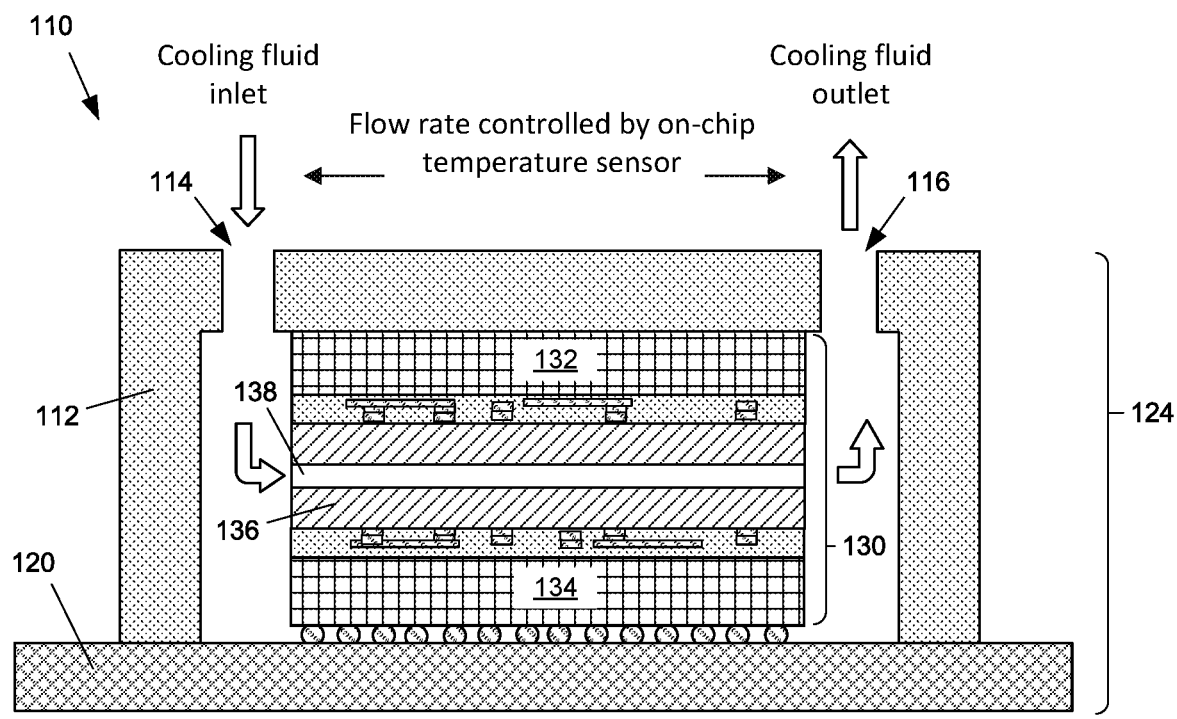
FIG. 11 is a side cross-sectional view of an integrated circuit package, according to one embodiment of the present description.

With reference to FIGS. 10 and 11, an embodiment of an electronic system 100 may include an IC package 110 coupled to a micro-pump 150 and a heat dissipation device 160 (e.g., a radiator, a fan, etc.). In this example, the IC package 110 includes a cooling module 112 with cooling fluid inlet(s) 114 of the cooling module 112 coupled to an outlet of the micro-pump 150, cooling fluid outlet(s) 116 of the cooling module 112 coupled an inlet of the micro-pump 150, and the liquid cooling path passing through the heat dissipation device 160.

The IC package 110 include a package substrate 120 attached to the cooling module 112, providing a sealed enclosure 124 for the cooling fluid. A 3DIC stack 130 inside the sealed enclosure 124 is attached between the cooling module 112 and the package substrate 120. The stack 130 includes at least a first silicon IC 132 and a second silicon IC 134 attached to opposite sides of an intermediate standoff substrate 136 (e.g., an interposer). The substrate 136 includes one or more microfluidic channels 138 therethrough in fluid communication with the cooling fluid inlet(s) 114 and cooling fluid outlet(s) 116 of the cooling module 112.

As shown in FIGS. 10 and 11, the intermediate standoff substrate 136 with microfluidic channel(s) 138 is placed in-between the two silicon chips 132 and 134. Liquid coolant is pumped by the micro-pump 150 and flows through the microfluidic channel(s) 138, bringing heat to the heat dissipation device 160 (e.g., an external radiator or fan). In some embodiments, the flow rate of the liquid cooling system may be electronically controlled by thermal management logic based on the output of one or more temperature sensors integrated on chip 132 and/or 134 (e.g., and/or the substrate 136).

In one embodiment of the present description, the microfluidic channels 138 are formed in the intermediate standoff substrate 136 for liquid cooling of the 3DIC stack 130 with hybrid bonding technology. Any suitable materials may be utilized for the intermediate standoff substrate 136 and any known process may be utilized to hybrid bond the first and second ICs 132 and 134 to the substrate 136 (e.g., or two parts of the substrate 136 to each other, as described in further detail below). For example, the chips 132 and 134 may be silicon and each of the silicon chips 132 and 134 and the intermediate standoff substrate may have outer dielectric layers (e.g., silicon dioxide ($SiO_2$)) and metal bond pads that are compatible with die stacking using hybrid bonding technology. The second IC chip 134 may be attached to the package substrate 120 by any known process, including solder interconnects such as solder balls or solder bumps.

Conventional die stacking uses solder interconnects which suffer from several scaling limitations. Hybrid bonding technology, removes many of these limitations and allows several order of magnitude improvements in die-to-die connection density. In one embodiment of the present description, hybrid bonding replaces solder-capped copper pillars with copper pads that are virtually co-planar with the substrate/die surface. The surfaces are processed through a chemical mechanical polishing (CMP) step that results in extremely flat and smooth dielectric surface. The electrical connection is formed through a two-step process. The first step is done at room temperature where the two substrate/die surfaces are brought in contact. This creates an instantaneous bond between the dielectric interfaces but does not form the full electrical connections. The second step is done by heating the two parts at elevated temperatures which causes the facing copper pads to expand and contact each other to form the electrical connections. It also further strengthens the dielectric to dielectric bond created at the first step. This temperature is maintained for enough time to allow the contacted copper pads to inter-diffuse and form a permanent metal bond that is maintained after the dies cool down.

Figure 12:
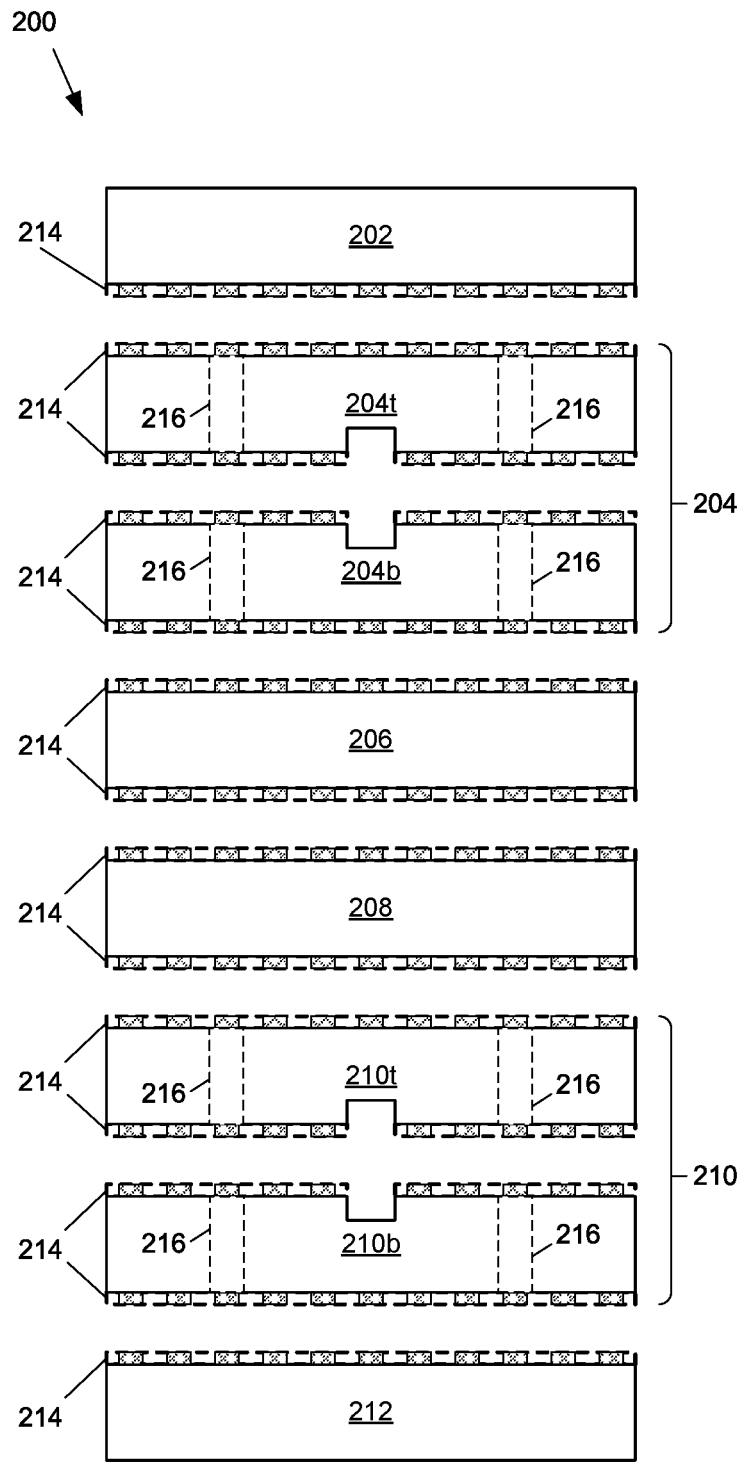
FIGS. 12 and 13 are illustrative side view of a three-dimensional integrated circuit stack, according to one embodiment of the present description.
Figure 13:
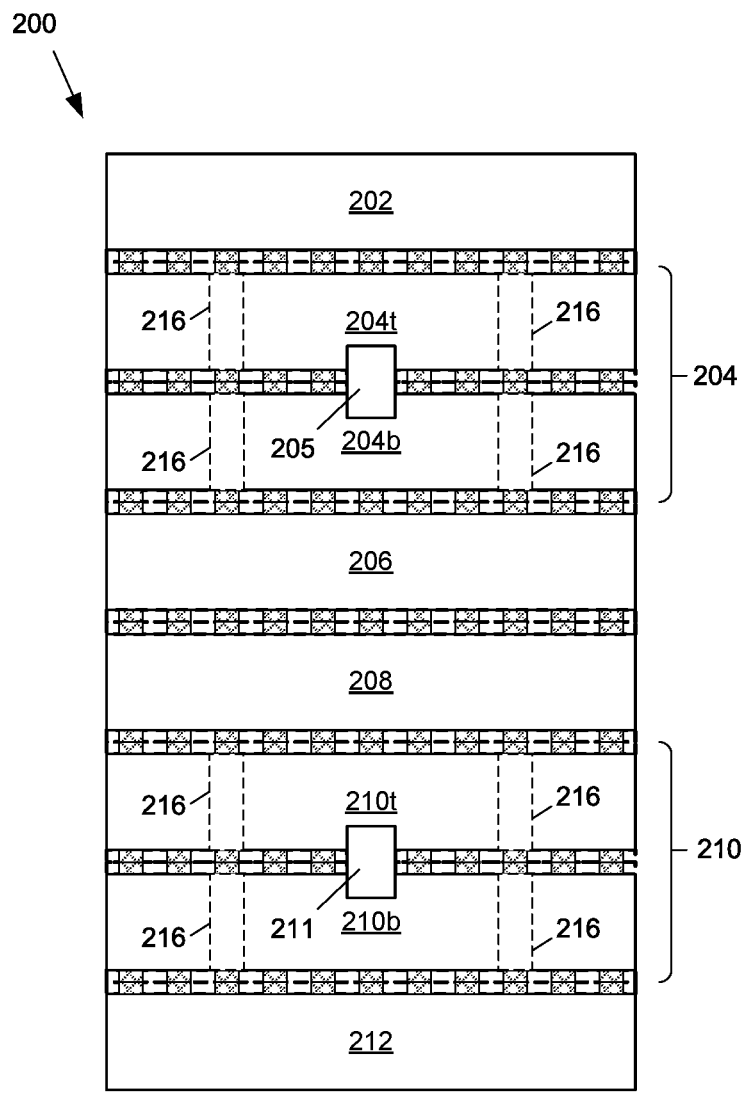

With reference to FIGS. 12-13, a 3DIC stack 200 shows how embodiments may include more than two IC chips and more than one liquid cooled interposer. The 3DIC stack 200 includes a substrate stack up of four IC chips 202, 206, 208, and 212 and two interposers 204 (with top and bottom parts 204t, 204b) and 210 (with top and bottom parts 210t, 210b). Each of the stacked substrates 202 to 212 include outer layer(s) 214 with bonds pads and dielectric material suitable for hybrid bonding. The bond where the two parts of the interposers 204 and 210 are attached to each other provides a hermetic seal for the microfluidic channels 205 and 211. The interposers 204 and 210 further include metal vias 216 (e.g., through both the top parts 204t, 210t and the bottom parts 204b, 210b) to provide electrical connections between the adjacent IC chips (e.g., and potentially through all the stacked IC chips, where the IC chips may provide electrical connections therethrough).

Figure 14:
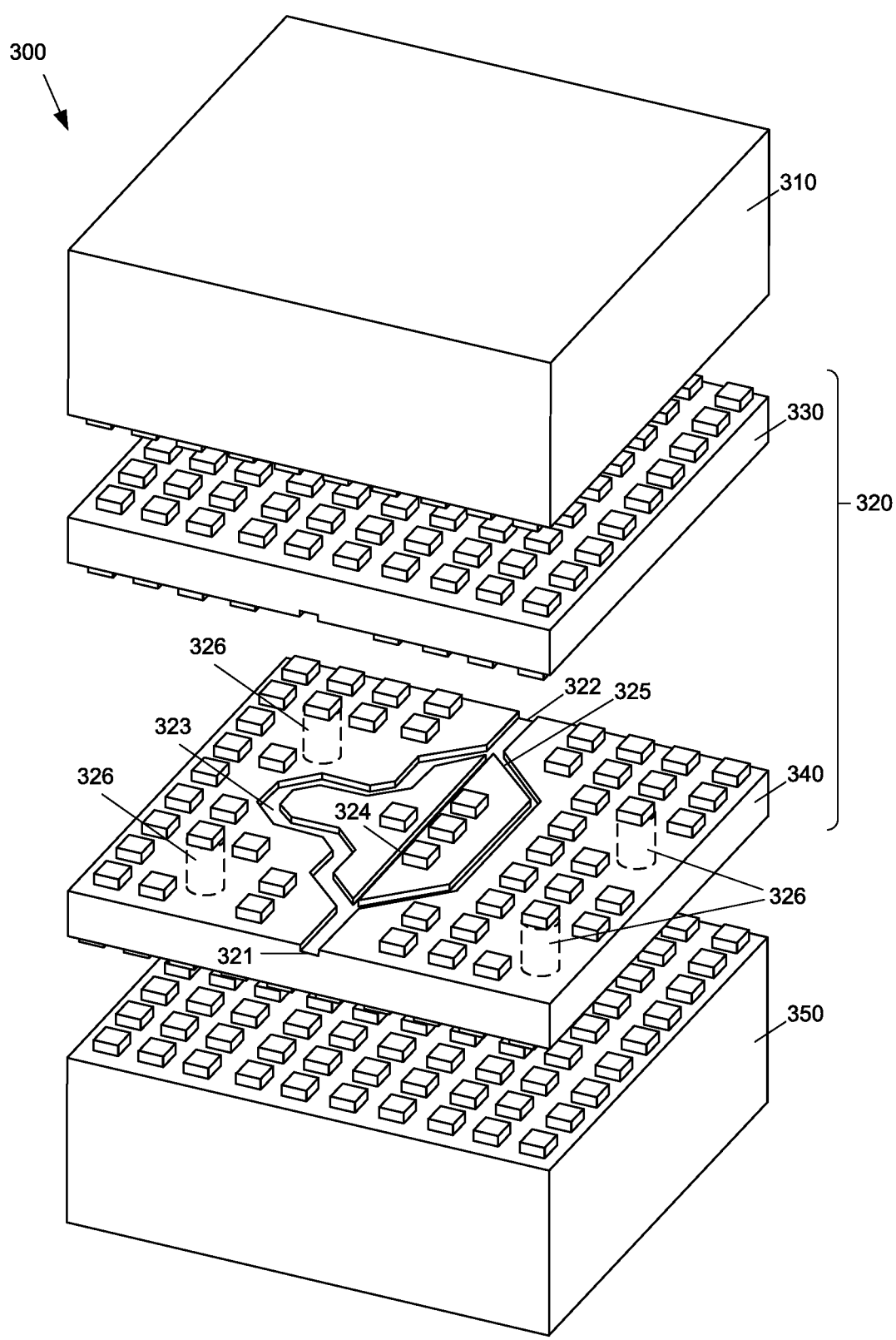
FIGS. 14 and 15 are illustrative exploded and perspective views of another three-dimensional integrated circuit stack, according to one embodiment of the present description.
Figure 15:
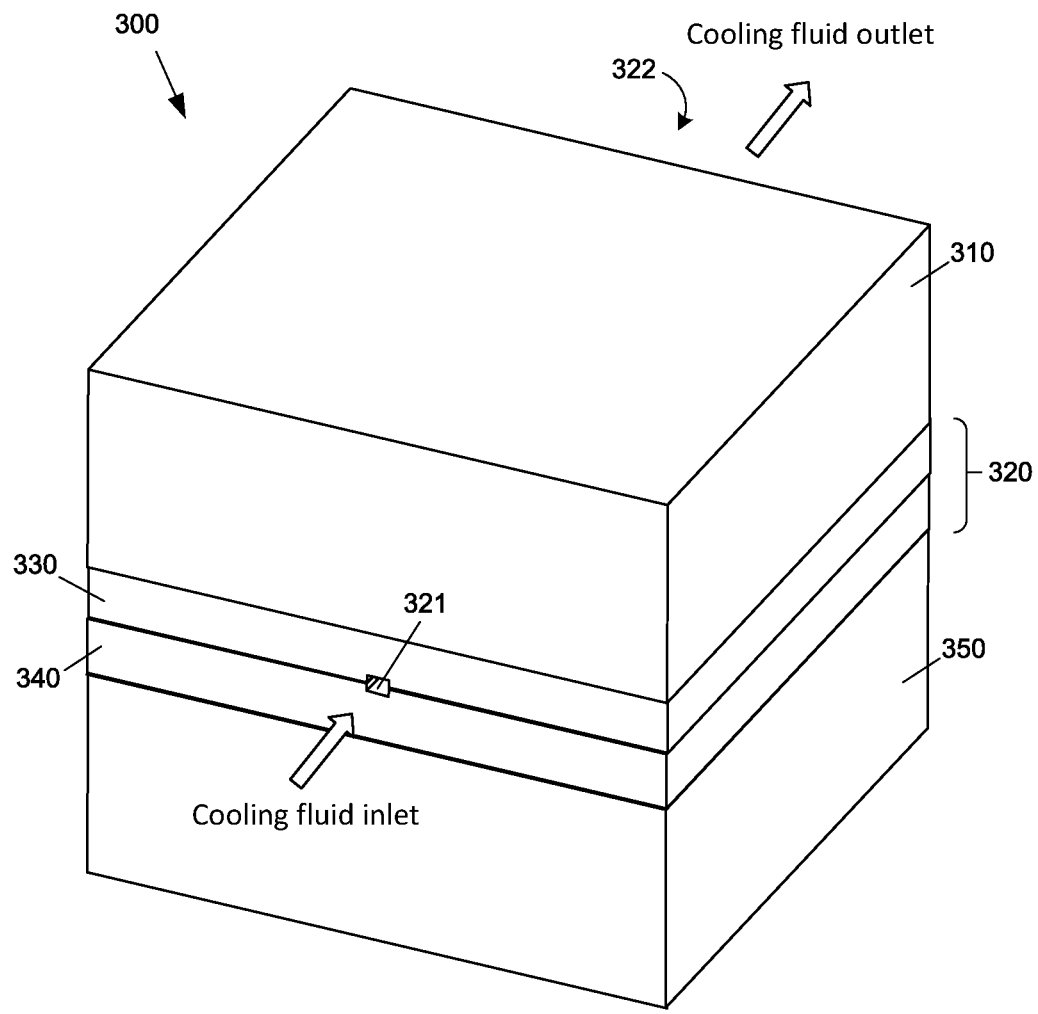

With reference to FIGS. 14-15, a 3DIC stack 300 includes a first IC chip 310, a standoff substrate 320 (e.g., an interposer with a top portion 330 and a bottom portion 340), and a second IC chip 350. The interposer 320 includes an inlet 321, an outlet 322, and multiple microfluidic channels 323, 324, and 325 in fluid communication with the inlet 321 and outlet 322. To enhance the overall cooling efficiency of the whole system, the channels on the standoff substrate can be designed according to power density of associated regions of the silicon chip in the 3DIC. For example, areas with higher power density can have wider channels, while areas with lower power density can have narrower channels (e.g., or no channels).

As illustrated in FIG. 14, an area of the interposer 320 provides the wider channel 323 with a loop (e.g., to cool a region of high power density), another area of the interposer provides the narrower channel 324 to cool a region with lower power density, and another area of the interposer 320 provides a medium width channel 325 with no loop to cool a region with medium power density. Other areas of the interposer 320 provide no channel (e.g., for lower power density regions). For extremely higher power density, the channels can be designed to flow around the region to dissipate heat more effectively (e.g., similar to the channel 323). Although not shown, the 3DIC stack 300 may also include an on-chip radiator employing the bonding pads of the hybrid bonding interface to further boost the cooling efficiency.

As shown in FIG. 14, the interposer 320 includes multiple metal vias 326 therethrough (e.g., in both the top portion 330 and the bottom portion 340) such that the interposer 320 acts as a bridge between the two IC chips 310 and 350. In the 3DIC stack 300, the top portion 330 may substantially mirror imaged the bottom portion 340 in terms of the arrangement of the channels 323, 324, and 325 and the metal vias 326, such that the corresponding portions of both portions 330 and 340 are substantially aligned when stacked as shown.

Figure 16:
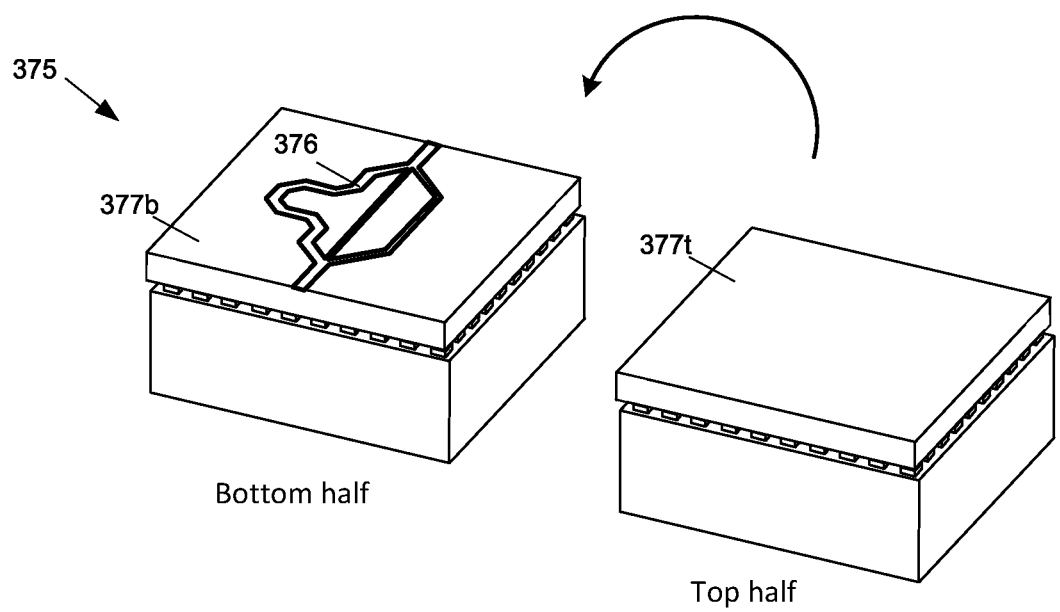
FIGS. 16 and 17 are illustrative perspective views of respective processes for fabrication of a three-dimensional integrated circuit stack, according to one embodiment of the present description.
Figure 17:
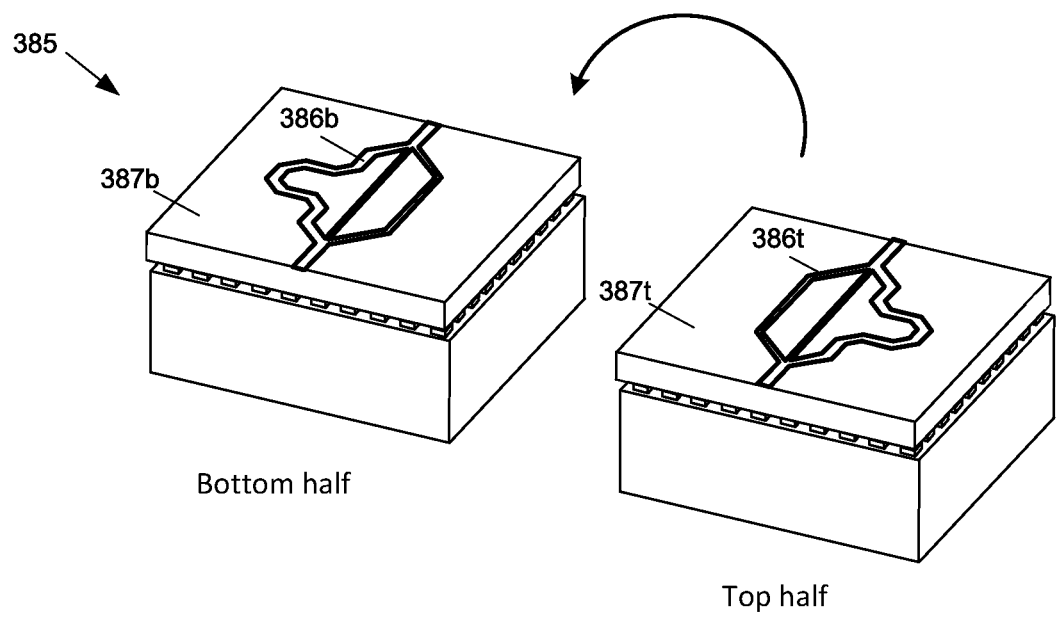

FIGS. 16 and 17 show two examples of processes to fabricate the microfluidic channels in respective 3DIC packages 375 and 385. As shown in FIG. 16, channels 376 can be built on a bottom half 377b of the standoff substrate. The top half 377t is flat and does not impose strict alignment tolerance in assembly process. The thickness of each half 377b, 377t can to be adjusted to cool both chips equally or emphasize on chips with higher power density. As shown in FIG. 17, mirror image channels 386t and 386b can be built on both halves (e.g., the top half 387t and the bottom half 387b) of the standoff substrate and bonded together to form the completed microfluidic channel. Utilizing both halves requires precise alignment between the two halves, but a deeper channel can be built, potentially increasing cooling efficiency.

Figure 18:
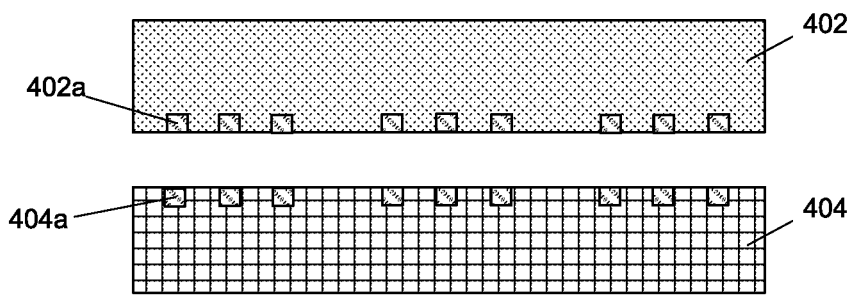
FIGS. 18-23 are side cross-sectional views of a process for fabrication of an integrated circuit package, according to an embodiment of the present description.
Figure 19:
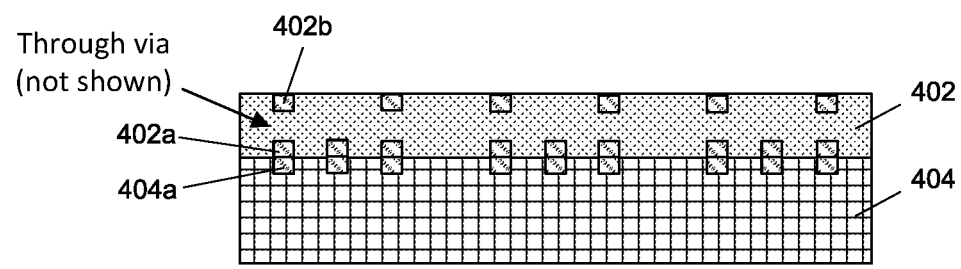
Figure 20:
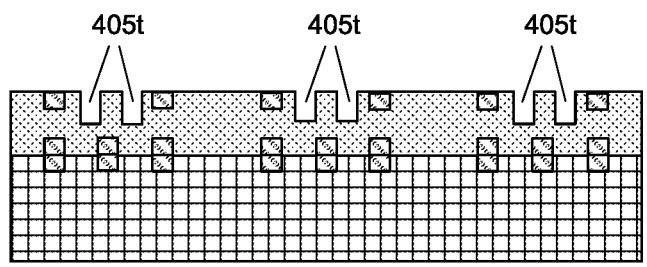

FIGS. 18-23 illustrate one embodiment of the fabrication of an integrated circuit package. As illustrated in FIG. 18, and standoff wafer 402 and a chiplet wafer 404 each include hybrid bond interface 402a and 404a. In FIG. 19, the standoff wafer 402 and the chiplet wafer 404 are hybrid bonded to each other, the standoff wafer 402 may be thinned, and hybrid bond interfaces 402b may be attached to the exposed side of the standoff wafer 402 (e.g., although not shown, metal through vias may connect bond pads on opposed sides of the standoff wafer 402). In FIG. 20, microfluidic channel top portions 405t are formed in the standoff wafer 402. In one embodiment of the present description, the microfluidic channels 405t are formed by a lithographic pattern and etch process.

Figure 21:
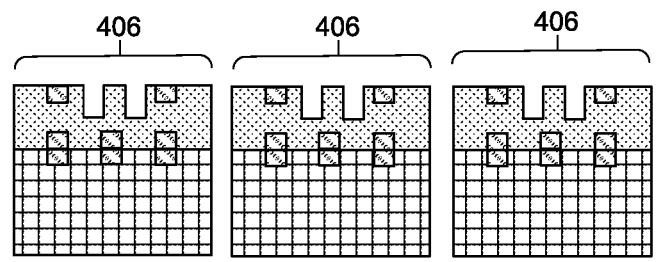
Figure 22:
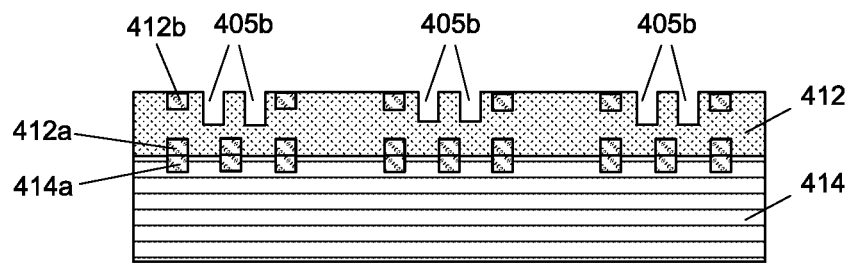
Figure 23:
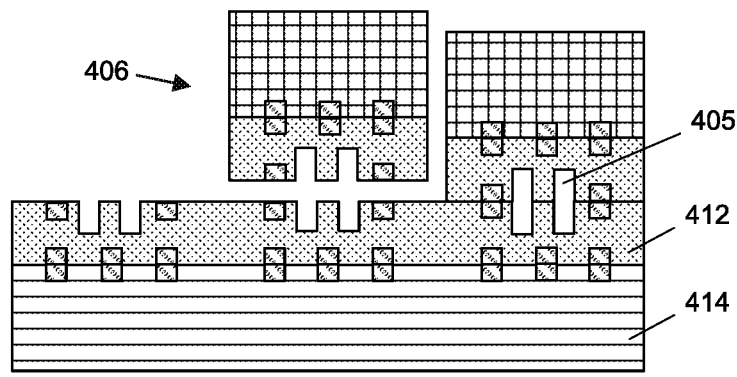

In FIG. 21, the standoff wafer 402 and chiplet wafer 404 are separated into two or more single die 406. In FIG. 22, a second chiplet wafer 414 (e.g., a base wafer) may be prepared, similar to as described above in connection with the chiplet wafer 404, and hybrid bonded to a second standoff wafer 412 (e.g., through hybrid bond interfaces 412a and 414a). Hybrid bond in interfaces 412b are added to the second standoff wafer 412 and microfluidic channel bottom portions 405b are formed in the second standoff wafer 412. In FIG. 23, one or more of the die 406 are hybrid bonded to the second standoff wafer 412 to form complete, hermetically sealed microfluidic channels 405.

Figure 24A:
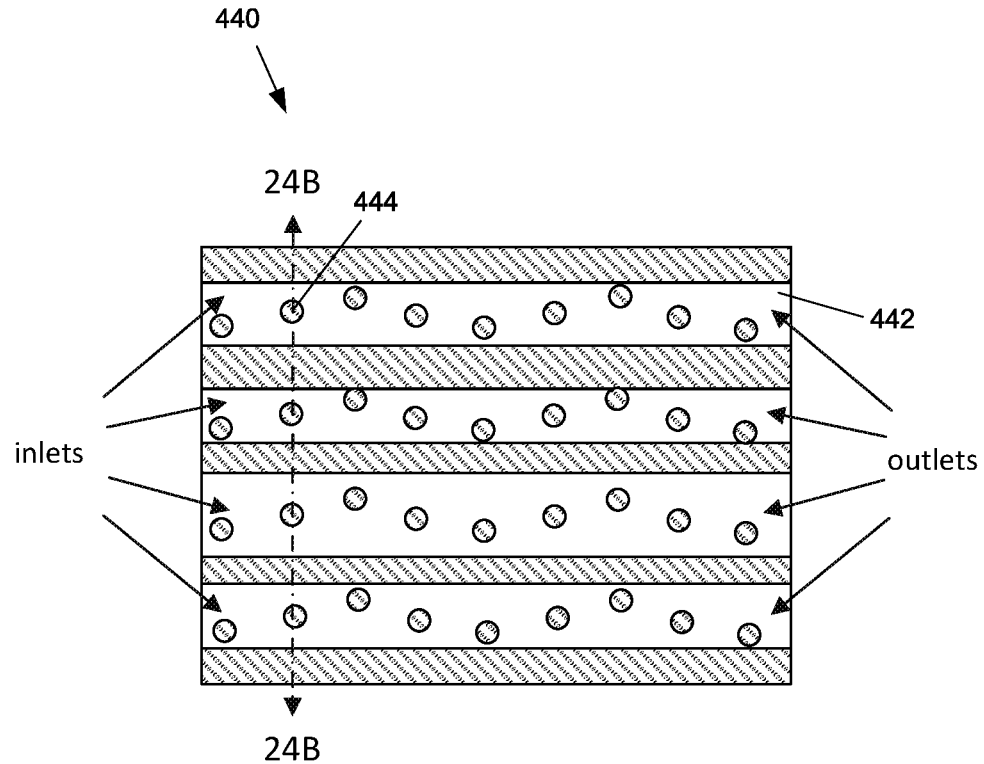
FIGS. 24A-B are illustrative top and side cross-sectionals view of an interposer, according to one embodiment of the present description.
Figure 24B:
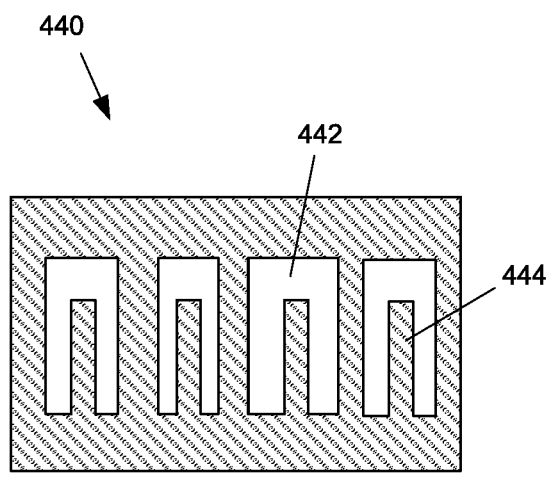

With reference to FIGS. 24A to 24B, an embodiment of an interposer 440 includes multiple channels 442 from respective inlets to respective outlets. The channels 442 may have different widths from one another (e.g., depending on the power maps of a die to be cooled). The channels 442 may be substantially straight as shown (e.g., or may be curved/meandered in other embodiments). Some of the channels 442 may include pins or pillars 444 for improved heat dissipation. For example, the pillars can extend partially through the channel thickness as shown (e.g., or may extend across the entire thickness (top to bottom) in other embodiments). When viewed from the top (see FIG. 24A), the pillars may have a round cross-section as shown (e.g., or may have a square, rectangular, triangular, or other cross-section in other embodiments).

Figure 25:
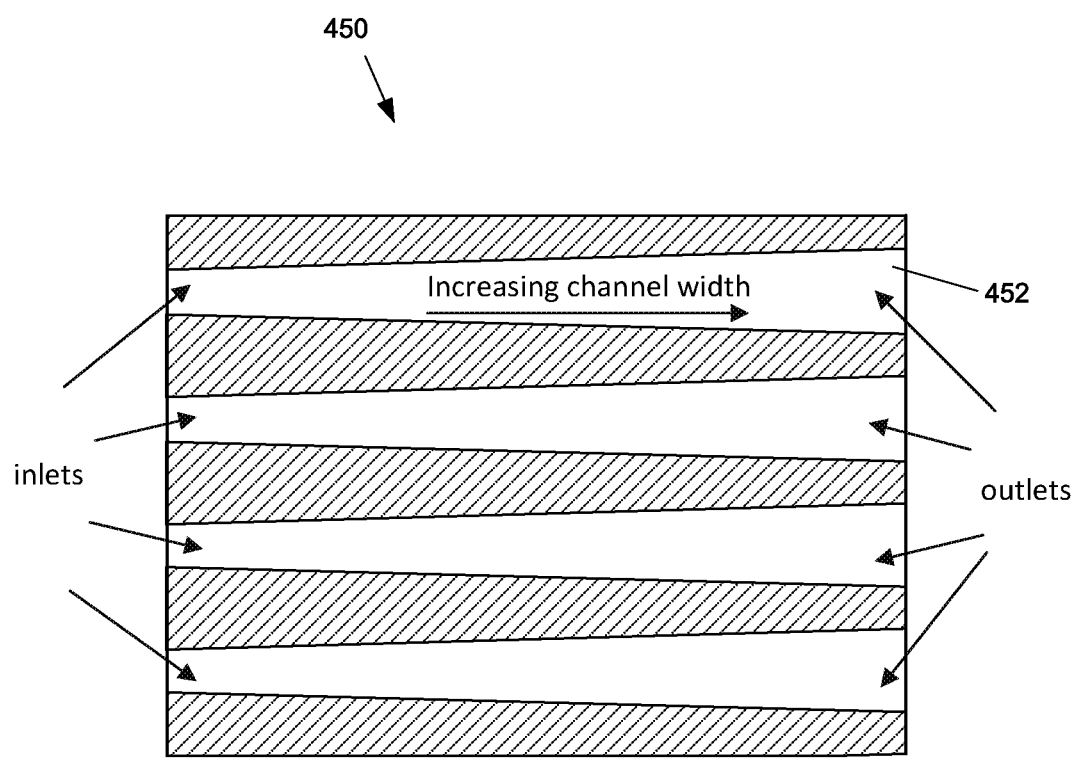
FIG. 25 is an illustrative top view of another interposer, according to one embodiment of the present description.

With reference to FIG. 25, an embodiment of an interposer 450 includes multiple channels 452 from respective inlets to respective outlets. The channels 452 may have increasing widths from the inlet to the outlet, such that a cross-sectional area of the outlet is larger than the cross-sectional area of the inlet (e.g., perpendicular to the flow direction).

In any of the above embodiments, the channel widths and heights may be in the range of 50-1000 um, and the channel lengths may be in the range of 5-30 mm. When included, the pillars in plane dimensions (e.g., diameter for a round pillar or side of a square pillar) may be in the range of 10-100 um.

Any suitable material may be utilized for the interposer, pins, pillars, etc. For example, suitable materials include highly thermally conductive materials to facilitate heat transfer and removal from the dies. Silicon, silicon carbide, or aluminum nitride are examples of suitable thermally conductive materials. Other suitable materials include glass. Low- or high-resistivity material may be used according to applications. In some embodiments, low-resistivity material may be utilized for increased thermal performance.

Figure 26:
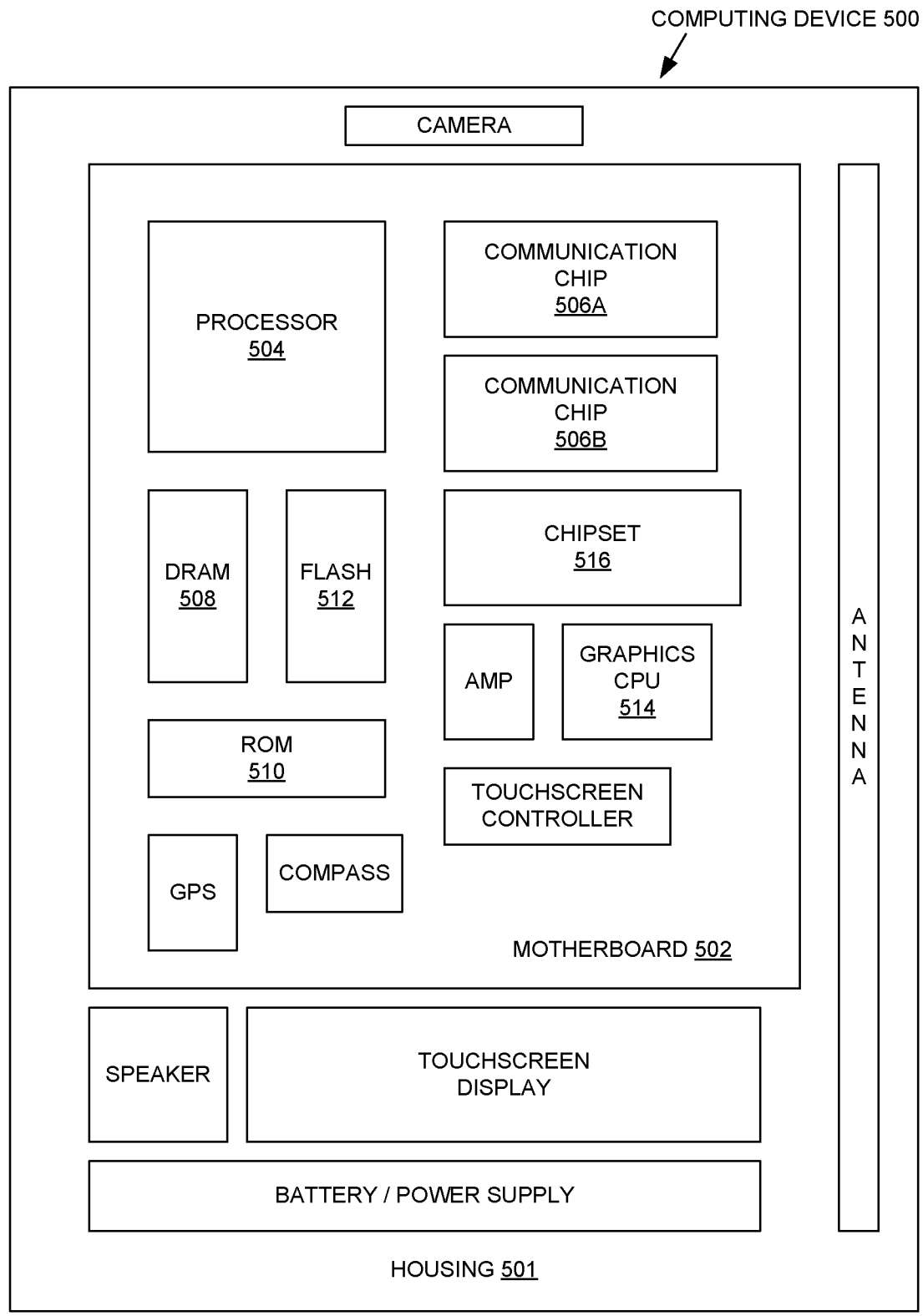
FIG. 26 is an electronic system, according to one embodiment of the present description.

FIG. 26 illustrates an electronic or computing device 500 in accordance with one implementation of the present description. The computing device 500 may include a housing 501 having a board 502 disposed therein. The computing device 500 may include a number of integrated circuit components, including but not limited to a processor 504, at least one communication chip 506A, 506B, volatile memory 508 (e.g., DRAM), non-volatile memory 510 (e.g., ROM), flash memory 512, a graphics processor or CPU 514, a digital signal processor (not shown), a crypto processor (not shown), a chipset 516, an antenna, a display (touchscreen display), a touchscreen controller, a battery/power supply, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 502. In some implementations, at least one of the integrated circuit components may be a part of the processor 504.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit package including an interposer, one or more microfluidic channels through the interposer, a first IC chip attached to a first side of the interposer, and a second IC chip attached to a second side of the interposer, where the first side of the interposer includes first bond pads coupled to first bond pads of the first IC chip, and the second side of the interposer includes second bond pads coupled to first bond pads of the second IC chip (e.g., and one or more of the other features or aspects of the embodiments described herein). The system 500 may further include a cooling module, a pump, and/or a heat dissipation device (not shown).

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-26. The subject matter may be applied to other integrated circuit devices and assembly applications, as well as any appropriate electronic application, as will be understood to those skilled in the art.

The follow examples pertain to further embodiments and specifics in the examples may be used anywhere in one or more embodiments, wherein Example 1 is an apparatus comprising an interposer, one or more microfluidic channels through the interposer, a first integrated circuit (IC) chip attached to a first side of the interposer, and a second IC chip attached to a second side of the interposer, where the first side of the interposer includes first bond pads coupled to first bond pads of the first IC chip, and the second side of the interposer includes second bond pads coupled to first bond pads of the second IC chip.

In Example 2, the subject matter of Example 1 can optionally include the interposer comprising a bridge between the first IC chip and the second IC chip.

In Example 3, the subject matter of any of Examples 1 to 2 can optionally include the interposer comprising a top portion attached to a bottom portion, where a first side of the top portion includes first bond pads coupled to first bond pads on a first side of the bottom portion.

In Example 4, the subject matter of Example 3 can optionally include only one of the top and bottom portions of the interposer include the one or more microfluidic channels.

In Example 5, the subject matter of Example 3 can optionally include both of the top and bottom portions of the interposer include respective portions of the one or more microfluidic channels.

In Example 6, the subject matter of any of Examples 1 to 5 can optionally include at least one of the one or more microfluidic channels including at least one heat dissipation structure that protrudes into the at least one microfluidic channel.

In Example 7, the subject matter of any of Examples 1 to 6 can optionally include the one or more microfluidic channels including at least a first microfluidic channel and a second microfluidic channel, and where a first cross sectional area of the first microfluidic channel perpendicular to a first flow direction at a first internal portion of the first microfluidic channel is different from a second cross sectional area of the second microfluidic channel perpendicular to a second flow direction at a second internal portion of the second microfluidic channel.

In Example 8, the subject matter of any of Examples 1 to 7 can optionally include a first cross sectional area of the one or more microfluidic channels perpendicular to a first flow direction at an inlet of the interposer being less than a second cross sectional area of the one or more microfluidic channels perpendicular to a second flow direction at an outlet of the interposer that is in fluid communication with the inlet of the interposer.

Example 9 is an apparatus comprising an integrated circuit (IC) package including a stack of integrated circuits including at least a first IC chip and a second IC chip, and an enclosure attached to the IC package, the enclosure including at least one inlet and at least one outlet, where the IC package further includes an interposer attached between the first IC chip and the second IC chip, and one or more microfluidic channels through the interposer and in fluid communication with at least one inlet and one outlet of the enclosure, and where a first side of the interposer includes first bond pads coupled to first bond pads of the first IC chip, and a second side of the interposer includes second bond pads coupled to first bond pads of the second IC chip.

In Example 10, the subject matter of Example 9 can optionally include the interposer comprising a bridge between the first IC chip and the second IC chip.

In Example 11, the subject matter of any of Examples 9 to 10 can optionally include the interposer comprising a top portion attached to a bottom portion, where a first side of the top portion includes first bond pads coupled to first bond pads on a first side of the bottom portion.

In Example 12, the subject matter of Example 11 can optionally include only one of the top and bottom portions of the interposer include the one or more microfluidic channels.

In Example 13, the subject matter of Example 11 can optionally include both of the top and bottom portions of the interposer including respective portions of the one or more microfluidic channels.

In Example 14, the subject matter of Example 9, where at least one of the one or more microfluidic channels includes at least one heat dissipation structure that protrudes into the at least one microfluidic channel.

In Example 15, the subject matter of Example 9 can optionally include the one or more microfluidic channels including at least a first microfluidic channel and a second microfluidic channel, and where a first cross sectional area of the first microfluidic channel perpendicular to a first flow direction at a first internal portion of the first microfluidic channel is different from a second cross sectional area of the second microfluidic channel perpendicular to a second flow direction at a second internal portion of the second microfluidic channel.

In Example 16, the subject matter of Example 9, can optionally include a first cross sectional area of the one or more microfluidic channels perpendicular to a first flow direction at an inlet of the interposer being less than a second cross sectional area of the one or more microfluidic channels perpendicular to a second flow direction at an outlet of the interposer that is in fluid communication with the inlet of the interposer.

Example 17 is an electronic system comprising a board, a power supply to provide power to one or more integrated circuit (IC) chips, an IC package coupled to the board and the power supply, the IC package including a stack of integrated circuits including at least a first IC chip and a second IC chip, and an enclosure attached to the IC package, the enclosure including at least one inlet and at least one outlet, where the IC package further includes an interposer attached between the first IC chip and the second IC chip, and one or more microfluidic channels through the interposer and in fluid communication with at least one inlet and one outlet of the enclosure, and where a first side of the interposer includes first bond pads coupled to first bond pads of the first IC chip, and a second side of the interposer includes second bond pads coupled to first bond pads of the second IC chip.

In Example 18, the subject matter of Example 17 can optionally include the interposer comprising a bridge between the first IC chip and the second IC chip.

In Example 19, the subject matter of Example 17, further comprising a pump coupled to at least one inlet and at least one outlet of the enclosure.

In Example 20, the subject matter of Example 19 can optionally further comprise a heat dissipation device coupled between at least one outlet of the enclosure and the pump.

In Example 21, the subject matter of any of Examples 17 to 20 can optionally include the interposer comprising a top portion attached to a bottom portion, where a first side of the top portion includes first bond pads coupled to first bond pads on a first side of the bottom portion.

In Example 22, the subject matter of Example 21 can optionally include only one of the top and bottom portions of the interposer include the one or more microfluidic channels.

In Example 23, the subject matter of Example 21 can optionally include both of the top and bottom portions of the interposer include respective portions of the one or more microfluidic channels.

In Example 24, the subject matter of any of Examples 17 to 23 can optionally include at least one of the one or more microfluidic channels including at least one heat dissipation structure that protrudes into the at least one microfluidic channel.

In Example 25, the subject matter of any of Examples 17 to 24 can optionally include the one or more microfluidic channels including at least a first microfluidic channel and a second microfluidic channel, and where a first cross sectional area of the first microfluidic channel perpendicular to a first flow direction at a first internal portion of the first microfluidic channel is different from a second cross sectional area of the second microfluidic channel perpendicular to a second flow direction at a second internal portion of the second microfluidic channel.

In Example 26, the subject matter of any of Examples 17 to 25 can optionally include a first cross sectional area of the one or more microfluidic channels perpendicular to a first flow direction at an inlet of the interposer being less than a second cross sectional area of the one or more microfluidic channels perpendicular to a second flow direction at an outlet of the interposer that is in fluid communication with the inlet of the interposer.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:
1. An apparatus, comprising:
an interposer;
one or more microfluidic channels through the interposer;
a first integrated circuit (IC) chip attached to a first side of the interposer; and
a second IC chip attached to a second side of the interposer,
wherein,
the first side of the interposer comprises first bond pads coupled to bond pads of the first IC chip, and the second side of the interposer comprises second bond pads coupled to bond pads of the second IC chip, and wherein the interposer comprises a top portion attached to a bottom portion, wherein a first side of the top portion comprises bond pads coupled to bond pads on a first side of the bottom portion.

2. The apparatus of claim 1, wherein the interposer comprises one or more metal vias between the first IC chip and the second IC chip.

3. The apparatus of claim 1, wherein the bonds pads on the first side of the top portion are hybrid bonded to the bond pads on the first side of the bottom portion.

4. The apparatus of claim 1, wherein the top portion and the bottom portion of the interposer each comprise respective portions of the one or more microfluidic channels.

5. The apparatus of claim 1, further comprising:
at least one heat dissipation structure that protrudes into one of the one or more microfluidic channels.

6. The apparatus of claim 1, wherein the one or more microfluidic channels comprise a first microfluidic channel and a second microfluidic channel, and wherein a first cross sectional area of the first microfluidic channel perpendicular to a first flow direction at a first internal portion of the first microfluidic channel is different from a second cross sectional area of the second microfluidic channel perpendicular to a second flow direction at a second internal portion of the second microfluidic channel.

7. The apparatus of claim 1, wherein a first cross sectional area of the one or more microfluidic channels perpendicular to a first flow direction at an inlet of the interposer is less than a second cross sectional area of the one or more microfluidic channels perpendicular to a second flow direction at an outlet of the interposer that is in fluid communication with the inlet of the interposer.

8. The apparatus of claim 1, further comprising:
an IC package comprising the interposer, the first IC chip, and the second IC chip; and
an enclosure attached to the IC package, the enclosure comprising at least one inlet and at least one outlet.

9. The apparatus of claim 8, further comprising:
a board coupled to the IC package; and
a power supply to provide power to the first IC chip and/or the second IC chip.

10. The apparatus of claim 8, further comprising:
a pump coupled to the at least one inlet and the at least one outlet of the enclosure; and/or
a temperature monitor on the first IC chip and circuitry coupled to the temperature monitor to control a flow rate of fluid through the one or more microfluidic channels.

11. An apparatus, comprising:
one or more microfluidic channels extending through an interposer, the interposer comprising a first portion attached to a second portion, wherein a first side of the first portion comprises bond pads coupled to bond pads of a first side of the second portion;
a first integrated circuit (IC) chip comprising bond pads attached to bond pads at a second side of the first portion opposite the first side of the first portion; and
a second IC chip comprising bond pads attached to a second side of the second portion opposite the first side of the first portion.

12. The apparatus of claim 11, wherein the interposer comprises one or more metal vias between the first IC chip and the second IC chip.

13. The apparatus of claim 11, wherein the bonds pads of the first side of the first portion are hybrid bonded to the bond pads of the first side of the second portion.

14. The apparatus of claim 11, wherein the first portion and the second portion of the interposer each comprise respective portions of the one or more microfluidic channels.

15. The apparatus of claim 11, further comprising:
at least one heat dissipation structure that protrudes into one of the one or more microfluidic channels.

16. The apparatus of claim 11, wherein the one or more microfluidic channels comprise a first microfluidic channel and a second microfluidic channel, and wherein a first cross sectional area of the first microfluidic channel perpendicular to a first flow direction at a first internal portion of the first microfluidic channel is different from a second cross sectional area of the second microfluidic channel perpendicular to a second flow direction at a second internal portion of the second microfluidic channel.

17. The apparatus of claim 11, wherein a first cross sectional area of the one or more microfluidic channels perpendicular to a first flow direction at an inlet of the interposer is less than a second cross sectional area of the one or more microfluidic channels perpendicular to a second flow direction at an outlet of the interposer that is in fluid communication with the inlet of the interposer.

18. The apparatus of claim 11, further comprising:
an IC package comprising the interposer, the first IC chip, and the second IC chip; and
an enclosure attached to the IC package, the enclosure comprising at least one inlet and at least one outlet.

19. The apparatus of claim 18, further comprising:
a board coupled to the IC package; and
a power supply to provide power to the first IC chip and/or the second IC chip.

20. The apparatus of claim 18, further comprising:
a pump coupled to the at least one inlet and the at least one outlet of the enclosure; and/or
a temperature monitor on the first IC chip and circuitry coupled to the temperature monitor to control a flow rate of fluid through the one or more microfluidic channels.

\* \* \* \* \*